United States Patent
Kosub

(10) Patent No.: US 11,402,345 B2
(45) Date of Patent: Aug. 2, 2022

(54) METHOD FOR CONTINUOUSLY DETERMINING ALL OF THE COMPONENTS OF THE RESISTANCE TENSOR OF THIN FILMS

(71) Applicant: HELMHOLTZ-ZENTRUM DRESDEN—ROSSENDORF E.V., Dresden (DE)

(72) Inventor: Tobias Kosub, Dresden (DE)

(73) Assignee: HELMHOLTZ-ZENTRUM DRESDEN—ROSSENDORF E.V., Dresden (DE)

( * ) Notice: Subject to any disclaimer, the term of this patent is extended or adjusted under 35 U.S.C. 154(b) by 89 days.

(21) Appl. No.: 16/981,735

(22) PCT Filed: Mar. 19, 2019

(86) PCT No.: PCT/EP2019/056760
§ 371 (c)(1),
(2) Date: Sep. 17, 2020

(87) PCT Pub. No.: WO2019/179972
PCT Pub. Date: Sep. 26, 2019

(65) Prior Publication Data
US 2021/0231595 A1    Jul. 29, 2021

(30) Foreign Application Priority Data
Mar. 20, 2018    (DE) .......................... 102018106466.7

(51) Int. Cl.
*G01N 27/04*    (2006.01)
*G01R 27/28*    (2006.01)
(Continued)

(52) U.S. Cl.
CPC ........... *G01N 27/041* (2013.01); *G01R 27/08* (2013.01); *G01R 27/28* (2013.01); *G01R 1/073* (2013.01)

(58) Field of Classification Search
CPC ........ G01R 27/00; G01R 27/02; G01R 27/08; G01R 27/28; G01R 1/00; G01R 1/02;
(Continued)

(56) References Cited

U.S. PATENT DOCUMENTS 11,156,574 B2 * 10/2021 Kosub .................... G01N 27/04

FOREIGN PATENT DOCUMENTS

DE    102007041612 A1    3/2009

OTHER PUBLICATIONS

International Search Report issued in PCT/EP2019/056760 and dated Mar. 19, 2019.
(Continued)

*Primary Examiner* — Hoai-An D. Nguyen
(74) *Attorney, Agent, or Firm* — Heslin Rothenberg Farley and Mesiti PC; Nicholas Mesiti

(57) ABSTRACT

A method for continuously determining all of the components of the resistance tensor of thin films, such as thin film resistors and thin film sensors of all types, is disclosed. A continuous determination of all the components of the resistance tensor is facilitated without switching the contact points using a minimum number of contacts. A homogeneous thin film part of any shape is provided with a least three contact points arranged at distances from one another. An input voltage is applied at each of the contact points, the current flowing through the contact points are detected, and the complete resistance tensor of the thin film part is determined from the voltage and current values.

20 Claims, 1 Drawing Sheet

(51) Int. Cl.
  *G01R 27/08* (2006.01)
  *G01R 1/073* (2006.01)
(58) Field of Classification Search
  CPC .......... G01R 1/06; G01R 1/067; G01R 1/073;
      G01N 27/00; G01N 27/02; G01N 27/04;
      G01N 27/041
  USPC ........ 324/600, 649, 691, 500, 512, 525, 549
  See application file for complete search history.

(56) References Cited

OTHER PUBLICATIONS

G T Kim et al. "Nonswitching van der Pauw technique using two different modulating frequencies," Review of Scientific Instruments, AIP, Melville, NY, US, vol. 70, No. 4, pp. 2177-2178 Apr. 1, 1999.
O. Riss et al. "Offset reduction in Hall effect measurements using a nonswitching van der Pauw technique", Review of Scientific Instruments, vol. 79, pp. 73901, Jul. 1, 2008.
D Grientschnig et al. "Method for measuring lectrical resistivity of anisotropic platelet-shaped crystals," Measurement Science and Technology, IOP, Bristol, GB, vol. 2, No. 2, pp. 118-126, Feb. 1, 1991.
J. Schurr et al. "The ac quantum Hall effect as primary standard of impedance," Institute of Physics Publishing, Metrologia 44, pp. 15-23, 2007.
Written Opinion issued in PCT/EP2019/056760 and dated Jul. 15, 2019, International Preliminary Report on Patentability for PCT/EP2019/056760 and dated Sep. 22, 2020.

\* cited by examiner

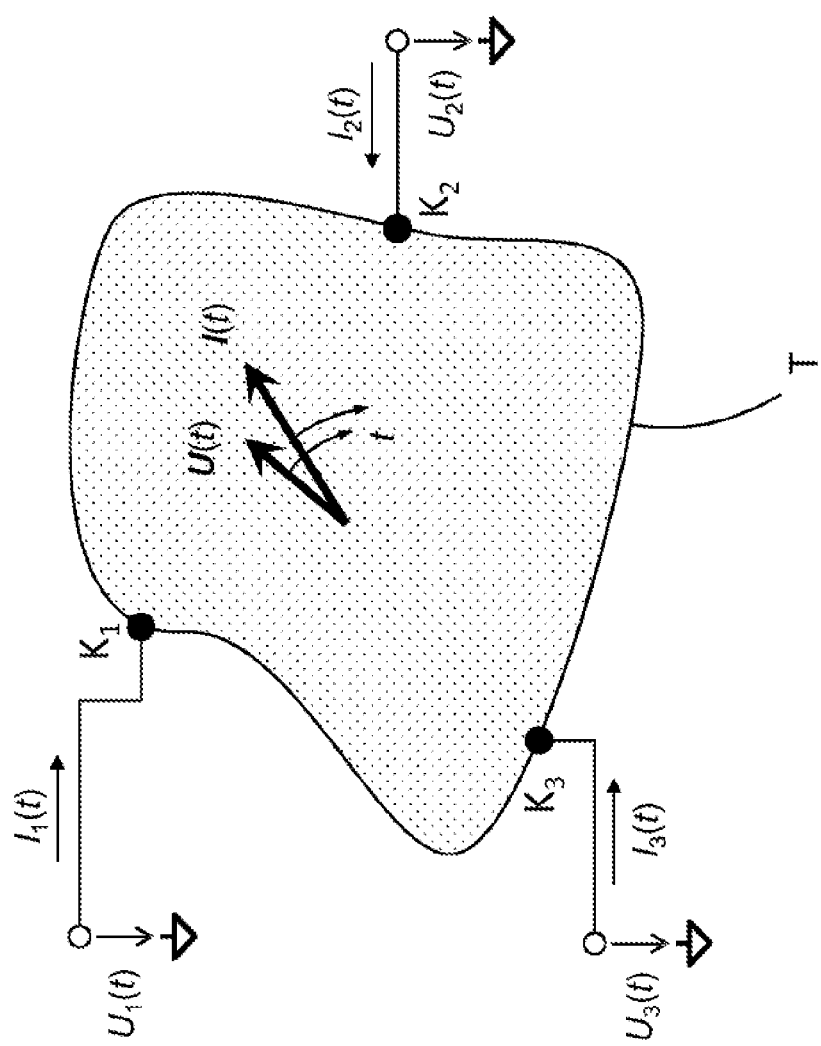

METHOD FOR CONTINUOUSLY DETERMINING ALL OF THE COMPONENTS OF THE RESISTANCE TENSOR OF THIN FILMS

CROSS REFERENCE TO RELATED APPLICATIONS

This application is the National Phase filing under 35 U.S.C. § 371 of International Application No. PCT/EP2019/056760, filed on Mar. 19, 2019, and published on Sep. 26, 2019 as WO 2019/179972 A1, which claims priority to German Application No. 102018106466.7, filed on Mar. 20, 2018. The contents of each of the prior applications are hereby incorporated by reference herein in their entirety.

The invention relates to a method for continuously determining all of the components of a resistance tensor of thin films, such as thin-film resistors and thin-film sensors of all types.

BACKGROUND

It is important to know or ascertain the parameters of thin films for their practical use. For this purpose, it is indispensable that the resistance tensor of thin-film resistors be determined, which is important in research to characterize transport phenomena and in industry resistance determinations are essential when reading out thin-film sensors of all types.

The general resistance tensor of an object consists of 9 components (3×3 matrix), wherein in the case of thin films, one spatial direction (the layer normal) loses significance in such a way that a thin film can be understood as a two-dimensional body. The electrical properties of this two-dimensional body can therefore be described using a reduced tensor. This reduced thin-film resistance tensor consists of four components, which form a 2×2 matrix.

Within this 2×2 matrix, however, only 3 values are physically independent. In the case of an isotropically conductive thin film, there are even only two physically independent variables, the longitudinal and the transverse resistance. The four components of the resistance tensor result as follows in this case:

$$\begin{Bmatrix} R_L & R_T \\ -R_T & R_L \end{Bmatrix}$$

One example of an arrangement for measuring the electrical resistance according to a so-called four-point method is disclosed in DE 31 23 427 C2. In particular, the measurement setup is described for a cathode sputtering facility having a planar movable substrate holder. In this case, four measurement contacts are guided from below through the substrate holder to a reference substrate resting thereon, which is provided with four low-resistance contacts. Alternatively, the measurement can also take place according to the two-point measurement method with the aid of direct-current or alternating current. In the case of a direct-current resistance measurement, a constant current is applied to the resistance to be measured, wherein the voltage dropping across it is used as the measured variable.

If the longitudinal resistance of a thin film is to be accurately determined, in general the so-called four-point measurement method is thus applied, in which two outer contacts conduct an applied current through a layer strip and two inner contacts are used to measure the voltage drop.

The four-point sheet resistance is calculated by using the measured values of the voltage and the current values to determine the sheet resistance therefrom. However, an analog geometric correction is still necessary for this purpose.

If a transverse resistance is to be measured, crossed structures are used, in which the voltage measurement points are as exactly opposite to one another as possible with respect to the current flow direction.

In both methods, there is the problem that production-related unavoidable geometry errors corrupt the measurement result by causing mixing of the longitudinal and transverse resistance at the measurement contacts.

One possible solution to the problem has become known in the form of the van der Pauw measurement method. In this case, four contacts are attached, each at a distance from one another, at the edge of an arbitrarily shaped homogeneous test section of a thin film. By alternately switching the contacts as current or voltage contacts and by subsequently offsetting the respective measurement results, the longitudinal and transverse component of the resistance tensor of the section can be inferred.

The van der Pauw measurement method has the disadvantage that switching over the current flow direction is subject to problems due to stray inductances between the test section (thin film) and the measurement electronics, because voltage peaks can result upon switching over which can damage the thin film or the measurement electronics. In addition, a decay time of the voltage peaks has to be expected, within which the measurement can be corrupted.

In KIM, G. T. [et al.]: Nonswitching van der Pauw technique using two different modulating frequencies. In Review of Scientific Instruments 70, 1999, pages 2177-2178, a method for measuring the resistance of sensitive samples using two independent AC sources and two lock-in amplifiers having two different frequency modulations is described.

A similar method is described in RISS, O. [et al.]: Offset reduction in Hall effect measurements using a nonswitching van der Pauw technique. In: Review of Scientific Instruments 79, 2008, pp. 73901-1 73901-3. It is a nonswitching van der Pauw Technik, which uses two electrically insulated AC sources, which operate using different frequencies and two lock-in amplifiers and is recommended for Hall effect measurements. The parasitic offset voltage which is typical of such measurement methods is reduced by simultaneous averaging of two simultaneously collected data sets.

In SCHURR, J. [et al.]: The AC quantum Hall effect as a primary standard of impedance. In: Metrologica 44, 2007, pages 15-23, it is stated that the quantum Hall resistance, which is measured at frequencies in the kilohertz range, displays frequency-dependent and current-dependent deviations from the quantified DC resistance value. This is ascribed to capacitive effects, which is reflected in the AC longitudinal resistance. Zeroing the AC longitudinal resistance results in a frequency-independent and current-independent quantum Hall resistance.

Another example of the application of the four-point method for dynamically compensating for the offset voltage of a Hall device is disclosed in DE 697 36 944 T2, in which a plate-like structure is provided with four contacts, which are arranged in the form of pairs of opposing contacts on the outer circumference of a conductive region.

The contact pairs are arranged offset by 90° here, wherein each contact pair is supplied with a periodic alternating current, whereby the phase shift of the supply currents corresponds to the spatial phase shift of the contact pairs, i.e., is 90°. The superposition of the supplied currents results in a continuous spinning current vector in the Hall device. By simultaneously measuring the voltages between the corresponding terminals, a signal can be isolated which consists of the Hall voltage and a periodic offset voltage. The offset voltage is removed by averaging the signal over at least one period.

A further disadvantage of the above-described four-point measurement method is the number of the required contacts and the accompanying circuitry and wiring expenditure. This is also the reason why two-point measurement methods are preferably used in integrated circuits.

SUMMARY OF THE INVENTION

The underlying object of the invention is to provide a method for continuously determining all components of a resistance tensor of thin films, such as thin-film resistors and thin-film sensors of all types, in which, using a minimized number of contacts, a continuous determination of all components of the resistance tensor is enabled without switching over the contact points.

This is achieved in that an arbitrarily shaped homogeneous section of the thin film is provided with at least three contact points arranged at distances with respect to one another for connection to an input voltage, wherein an input voltage is applied at each of the contact points, that the currents flowing through the contact points are acquired, and that the complete resistance tensor of the section of the thin film is determined from the voltage and current values.

In a first design of the invention, with continuous change of the input voltages at the three contact points, the voltage and current vectors required for the determination of the resistance tensor are calculated. In a refinement of the invention, with measured objects having arbitrary dimensionality, the number of the contact points exceeds the dimensionality of the measured object by at least 1.

Since the measurement of transverse resistances generally takes place at high resistance, it is advantageous if the impedance of the input voltages is increased to measure transverse resistance effects.

The input voltages applied to the contact points are preferably each phase-shifted sinusoidal AC voltages, wherein the input voltages applied at the contact points have a phase difference with respect to the respective adjacent input voltage as a function of the number of the contact points.

The phase difference of the input voltages is particularly preferably 120° with three contact points (three-phase current principle), which decreases accordingly with the increase of the number of the contact points and is 90° on average with four contact points and 72° with five contact points.

Furthermore, an intrinsically caused chronological phase offset of multiple measurements can be compensated for by changing the direction of current rotation.

Alternatively, the input voltages can be noise signals and/or the input voltages are subjected to a noise shaping process.

Furthermore, the Fourier transform or Görtzel filtering of the voltage and current waveform can be used to determine the amplitudes and phases directly from the complex results.

The invention offers an option for minimizing the number of required contact points in precision measurements and permits the components of the resistance tensor to be resolved without interfering switching over of current and voltage. On the one hand, the advantage results therefrom that the circuit complexity can be reduced for commercial products, which can result in resource savings and an increase in durability. On the other hand, the advantage results for precision measurements in science that the negative aspects of the stray inductance are alleviated, which can result in significant restrictions in particular with long connecting lines between layer and electronics, as can be the case, for example, in major research facilities.

BRIEF DESCRIPTION OF THE DRAWING FIGURES

FIG. 1 is a representation of the use of a method for continuously determining all of the components of the resistance tensor of thin films in accordance with one aspect of the present invention.

The invention is explained in greater detail hereinafter on the basis of exemplary embodiments.

The associated FIGURE of the drawing shows an arbitrarily shaped homogeneous section T of the thin film having at least three contact points K1 to K3 arranged at distances from one another.

Time-variable input voltages $U_i(t)$ are applied at the contact points K1 to K3 and the time-variable currents $I_i(t)$ are determined. With vectorial addition of the 3 voltages and the 3 currents, a time-variable voltage vector U (t) and a time-variable current vector I(t) result. These vectors are linked to one another via the electrical resistance tensor ρ according to $U(t)=\rho I(t)$.

A linear equation system may be formed from this matrix equation having the known vector U and the known vector I. This equation system is then uniquely solvable for thin films if precisely two value pairs $(U(t), I(t))_1$ and $(U(t), I(t))_2$ exist. Linearly independent means that the two current vectors from both value pairs are not parallel, and also the two voltage vectors from both value pairs are not parallel. If more than two value pairs $(U(t), I(t))_j$ exist, the electrical resistance tensor ρ thus generally cannot be uniquely determined.

However, it is possible to specify a regression solution, which unifies all value pairs in the best possible manner in accordance with the method of least-squares deviation. It is accordingly possible to increase the accuracy of the determination of the electrical resistance tensor ρ by measuring more than two value pairs, if the measurements are subject to noise (for example, measurement noise).

After the electrical resistance tensor ρ has been determined by means of the described method, important further variables can be calculated. The electrical conductivity tensor ρ thus results by way of matrix inversion from the electrical resistance tensor ρ.

A further expedient operation is triangularization of the electrical resistance tensor ρ by means of Schur decomposition. In this representation $\rho_{Schur}$ of the resistance tensor, the independent components of the resistance tensor result explicitly. For example, in the case of a two-dimensional thin film, the electrical resistance tensor ρ is a 2×2 matrix. In Schur form $\rho_{Schur}$, in principle the highest and lowest longitudinal resistances result on the main diagonals and the transverse resistance results in the upper adjacent diagonal element.

To carry out the determination of the resistance tensor in the described procedure, the number of the contact points Ki has to exceed the dimensionality of the measured object by at least one. In the case of thin films, which are generally considered to be a two-dimensional object, three contact points K1, K2, K3 are therefore required to completely determine the resistance tensor. The number of the contact points is reduced by one with respect to previous methods.

However, this procedure is also conceivable in other dimensions N, wherein the special case of the electrical two conductor measurement results for N=1 from the present invention. The 9-component resistance tensor of three-dimensional objects (N=3) can be completely acquired by means of four contact points. A theoretical expansion to abstract higher dimensional objects is also conceivable.

A special case of the input voltages $U_i(t)$ is described hereinafter, which simultaneously generates many items of information about the test object and is easily implementable at the same time. For a two-dimensional test section and a number of contact points Ki of 3, three voltage values can be selected at every point in time. This permits the simultaneous fulfillment of three boundary conditions. One advantageous boundary condition is that the total of the voltage values is equal to zero, whereby it is ensured that the test section is always at the same average electrical potential. Direction and length of the voltage vector U(t) can be randomly determined via the two remaining boundary conditions.

Thus, not only is the resistance tensor ρ determined, but rather also its dependencies on the excitation frequency (by spectral analysis of the noise) and its dependence on the amperage are depicted in the measured values. The frequency and current dependencies of all resistance tensor components are thus determinable simultaneously, whereby the respective individual measurements are possibly superfluous.

By further limiting of possible values for direction and length of the voltage vector U(t), the excitation noise can be shaped in such a way that a specific dimension is depicted particularly efficiently, for example, the resistance tensor ρ at precisely 125 Hz and 1000 Hz, or the frequency dependence of the resistance tensor ρ between 50 Hz and 1000 Hz and arbitrary other values from the amperage-frequency space of the resistance tensor ρ.

A special case is described in the following part which relates to the case of a two-dimensional measured object. In this case, a tensorial resolution of the electrical resistance can also be achieved without solving an equation system.

The special case relates to sinusoidal voltage curves of the phase-shifted input voltages $U_i(t)$ at the contact points K1 to K3. In this case, a different evaluation can be performed, in which a linear equation system does not have to be solved to determine the resistance tensor ρ. Instead, the time-dependent voltage absolute values |U|(t) and current absolute values |I|(t) and phase angles $\varphi_U(t)$ and $\varphi_I(t)$ of the voltage and current vectors are calculated from the time-dependent voltage and current vectors U(t) and I(t). The longitudinal and transverse resistance may then be computed from these dimensions. This method always separates between longitudinal and transverse resistance, but only results in an average longitudinal resistance value in the case of an anisotropic longitudinal resistance.

For this purpose, the time-dependent variables are observed over a rotation of the voltage and current vectors.

The longitudinal resistance is then formed from:

$$R_L = \left\langle \frac{|U|(t)}{|I|(t)} \right\rangle \cos\langle \varphi_U(t) - \varphi_I(t) \rangle$$

The transverse resistance follows from:

$$R_T = \left\langle \frac{|U|(t)}{|I|(t)} \right\rangle \sin\langle \varphi_U(t) - \varphi_I(t) \rangle$$

In the method for continuously determining all components of a resistance tensor ρ in thin films, such as thin-film resistors and thin-film sensors of all types, or also in the case of thin conductive layers, such as metal layers, a section T is presumed which is provided with at least three contact points K1 to K3 for connection to a different input voltage $U_i(t)$ in each case, wherein the contact points K1 to K3 enclose an arbitrarily large surface section T of the thin film, the resistance tensor ρ of which is to be determined. The maximum number of the contact points for carrying out the method according to the invention is theoretically not limited, wherein the wiring expenditure and the computing expenditure for carrying out the method increase with the number of the contact points and are thus subject to economic limits, however.

In contrast to the van der Pauw method, in which at least four contact points Ki are applied at the edge of an arbitrarily shaped homogeneous section, each at a distance to one another, and alternating switching of the contact points K1 to K4 as current or voltage contacts is carried out to determine the resistance tensor ρ of the section by offsetting the respective measurement results, in the method according to the invention, by applying different input voltages at the contact points, a change of the voltage vector U(t) and thus also a change of the current vector I(t) is provoked in the section T of the thin film enclosed by the contact points.

The resulting input voltage vector U(t) may be defined by vectorial addition of the input voltages and the resulting current vector I(t) may be defined by vectorial addition of the input currents flowing through the contact points Ki. The resistance tensor ρ may be reconstructed from the ratio of the amplitudes and the phases of the input voltage and current vectors U(t), I(t).

The vectorial addition is described hereinafter, by which the voltage vectors U(t) and the current vectors I(t) are formed. The voltages $U_i(t)$ applied at the M contact points Ki are scalar voltage values which indicate the electrical potential differences with respect to a common reference potential (for example, ground potential). The contact currents $I_i(t)$ are also scalar current values which indicate the dimension of the electrical current through the respective contact point Ki into the section T of the thin film. To form a three-dimensional voltage vector from these scalar voltage values, M arbitrary n-dimensional spatial directions $n_i$ are selected, which are nonparallel to one another. All spatial directions $n_i$ are unity vectors, which means that $|n_i|=1$. The voltage vector U(t) and the current vector I(t) can then be determined via:

$$U(t) = \sum_i^M n_i U_i(t)$$

$$I(t) = \sum_i^M n_i I_i(t)$$

The selection of the spatial directions $n_i$ is not restricted in addition to the condition of being mutually nonparallel. In particular, the $n_i$ do not have to correspond to the actual spatial directions of the contact points Ki. The selected $n_i$ are advantageously along the spatial directions of the M contact points Ki and the section T is advantageously a regular M-polygon, wherein the contacts are each on one of the M axes of symmetry of T and are M-fold rotationally-symmetrical with respect to one another.

A rotation of the input voltage vector U(t) may be provoked most simply if sinusoidal input voltages $U_i(t)$ having a predetermined phase difference with respect to one another according to the three-phase current principle are used as input voltages, wherein more than three phases can also come into consideration.

Alternatively, the input voltage signals $U_i(t)$ can also be independent noise signals, whereby a voltage vector U(t) continuously changing in absolute value and direction results. These noise signals can be formed by spectrally unshaped (white) noise or can be subjected to a spectral noise shaping process.

The following exemplary embodiment relates to the method according to the invention for determining all components of a resistance tensor ρ in an arbitrarily shaped homogeneous section T, which is provided with three electrical contact points K1 to K3, wherein the contact points Ki form the corners of a triangle.

A sinusoidal input voltage $U_i(t)$ is applied to each of these contact points K1-3, which has in each case a phase difference of 120° with respect to the voltage at the respective adjacent contact point K1; K2; K3, i.e., the three-phase current principle is applied for determining the resistance tensor ρ. If more than three contact points are used to determine the resistance tensor ρ, the phase differences between the input voltages become less, i.e., in the case of four contact points K the phase difference is 90° on average, and 72° on average with five contact points K, etc.

The input voltages $U_i(t)$ are added vectorially in accordance with the known phase differences thereof to determine the voltage vector U(t), which rotates due to the phase difference of the sinusoidal voltages applied at the contact points K.

During this procedure, the input currents $I_i(t)$ flowing through the contact points K are measured and added vectorially in accordance with the phase differences to determine the instantaneous current vector I(t), which also rotates.

The measured values are supplied via multiplexed A/D converters, or also by way of simultaneous A/D converters, to digital further processing.

For the (idealized) case that the contact points K1 to K3 enclose a perfectly symmetrical triangle and no transverse resistance is present, the current vector I(t) is always in phase with the voltage vector U(t), so that their ratio describes the longitudinal resistance.

The resistance tensor ρ can be determined from the ratio of the amplitudes and the phases of voltage and current vector U, I.

However, practically it has to be assumed that it is an arbitrary triangle in which the current vector I(t) is generally not in phase with the voltage vector U(t). If the phase difference of both vectors is integrated over a complete rotation around 360°, zero nonetheless results. This means that deviations from the ideal triangle are negligible if complete rotations of the voltage vector are observed.

During a rotation around 360°, it can occur, for example, that the current vector firstly has a positive phase difference with respect to the voltage vector. If it is now rotated further, this phase difference decreases, goes through zero, and becomes negative. The phase difference itself thus swings up and down during the rotation. Over a complete rotation, it would be exactly as much negative as positive and is zero over 360°. This case is also generally valid with nonideal triangles. Ideal triangles are a special case in that the phase difference is 0 the entire time therein.

If the section T also has a transverse resistance in addition to the longitudinal resistance (for example, Hall effect), a transverse current also flows during the described voltage application, so that the current vector I(t) is deflected over the entire rotation. The result is that the integral of the phase difference between current and voltage is no longer zero, but rather a value dependent on the transverse resistance results.

Therefore, to determine the resistance tensor of the section T, it is necessary to measure the transverse resistance effects, which generally takes place at high resistance. However, since ideal voltage sources are low resistance, it is reasonable to increase the impedance of the voltage sources during the measurement of the transverse resistance. This can be achieved easily using additional resistors, so that the low transverse currents are better measurable.

For the case that the connecting lines to the contact points K or the layer geometry contain inductances or capacitances themselves, these reactive influences can thus influence the measured value of the transverse resistance component.

In addition, a time offset of the 6 measurements on multiplexed A/D converters can cause an apparent phase offset. These effects may be separated from intrinsic transverse resistance effects of the thin layer by exchanging the current direction of rotation. The intrinsically caused phase offset is then also exchanged.

LIST OF REFERENCE SIGNS $K_i$ contact points
$U_i(t)$ input voltage
$I_i(t)$ input current
I(t) current vector
U(t) voltage vector
T surface section
ρ resistance tensor
M number of contacts
$n_i$ spatial directions

The invention claimed is:

1. A method for continuously determining all components of a resistance tensor in thin films, comprising:
    providing an arbitrarily shaped homogeneous section of the thin film with at least three contact points arranged at distances with respect to one another simultaneously applying an input voltage $U_i(t)$ at each of the contact points;
    acquiring currents $I_i(t)$ flowing through the contact points; and
    determining the complete resistance tensor ρ of the section of the thin film from the voltage and current values.

2. The method as claimed in claim 1, further comprising calculating the voltage and current vectors U(t), I(t) required for the determination of the resistance tensor ρ with continuous change of the input voltages $U_i(t)$ at the three contact points.

3. The method as claimed in claim 1, wherein, with measured objects having arbitrary dimensionality, the number of the contact points exceeds the dimensionality of the measured object by at least 1.

4. The method as claimed in claim 1, wherein the source impedance of the input voltages $U_i(t)$ is increased to measure transverse resistance effects.

5. The method as claimed in claim 1, wherein the input voltages $U_i(t)$ applied to the contact points are phase-shifted sinusoidal AC voltages.

6. The method as claimed in claim 1, wherein the input voltages $U_i(t)$ applied at the contact points have a phase difference with respect to the respective adjacent input voltage $U_i(t)$ as a function of the number of the contact points.

7. The method as claimed in claim 6, wherein the phase difference of the input voltages $U_i(t)$ is 120° with three contact points and decreases accordingly with the increase of the number of the contact points and is 90° on average with four contact points and 72° with five contact points.

8. The method as claimed in claim 1, wherein an intrinsically caused chronological phase offset of multiple measurements of the current $I_i(t)$ is separated from parasitic phase offset influences by changing the direction of rotation of the voltage vector.

9. The method as claimed in claim 1, wherein the input voltages $U_i(t)$ are noise signals.

10. The method as claimed in claim 1, wherein the input voltages $U_i(t)$ are subjected to a noise shaping process.

11. The method as claimed in claim 1, wherein the Fourier transform or Görtzel filtering of the voltage and current waveform is used to determine the amplitudes and phases directly from the complex results.

12. The method as claimed in claim 7, wherein an intrinsically caused chronological phase offset of multiple measurements of the current is separated from parasitic phase offset influences by changing the direction of rotation of the voltage vector.

13. The method as claimed in claim 12, wherein the input voltages are noise signals.

14. The method as claimed in claim 13, wherein the input voltages are subjected to a noise shaping process.

15. The method as claimed in claim 14, wherein the Fourier transform or Görtzel filtering of the voltage and current waveform is used to determine the amplitudes and phases directly from the complex results.

16. A method for continuously determining all components of a resistance tensor in thin films, comprising:
providing an arbitrarily shaped homogeneous section of the thin film with at least three contact points arranged at distances with respect to one another
applying an input voltage $U_i(t)$ at each of the contact points;
acquiring currents $I_i(t)$ flowing through the contact points;
determining the complete resistance tensor ρ of the section of the thin film from the voltage and current values; and
wherein the source impedance of the input voltages $U_i(t)$ is increased to measure transverse resistance effects.

17. The method as claimed in claim 16, wherein the input voltages $U_i(t)$ applied to the contact points are phase-shifted sinusoidal AC voltages.

18. The method as claimed in claim 16, wherein an intrinsically caused chronological phase offset of multiple measurements of the current $I_i(t)$ is separated from parasitic phase offset influences by changing the direction of rotation of the voltage vector.

19. The method as claimed in claim 16, wherein the input voltages $U_i(t)$ are noise signals.

20. A method for continuously determining all components of a resistance tensor in thin films, comprising:
providing an arbitrarily shaped homogeneous section of the thin film with at least three contact points arranged at distances with respect to one another
applying an input voltage $U_i(t)$ at each of the contact points;
acquiring currents $I_i(t)$ flowing through the contact points;
determining the complete resistance tensor ρ of the section of the thin film from the voltage and current values; and
wherein the input voltages $U_i(t)$ applied at the contact points have a phase difference with respect to the respective adjacent input voltage $U_i(t)$ as a function of the number of the contact points.

\* \* \* \* \*